Figure 3:
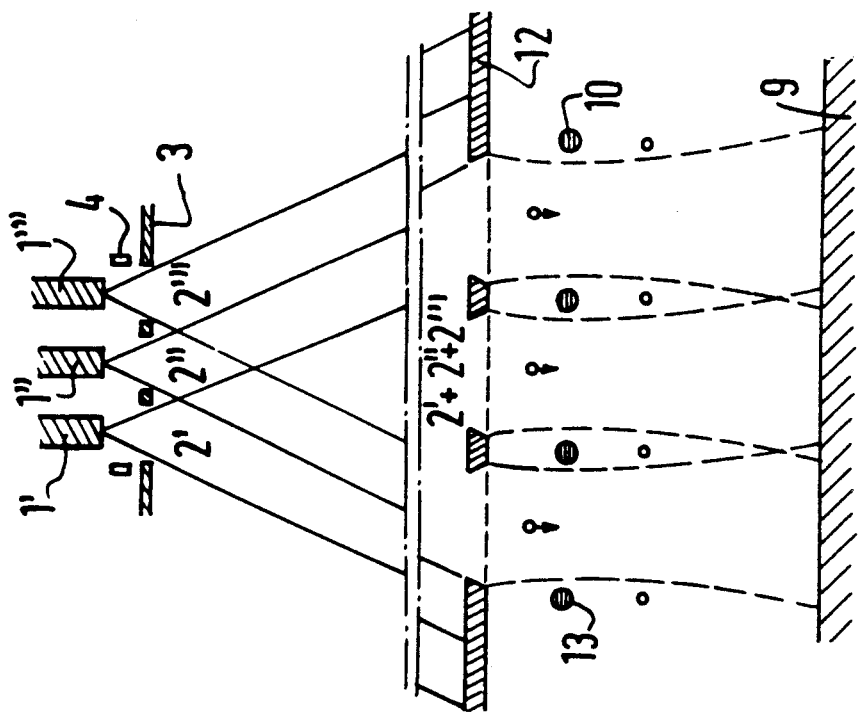

United States Patent [19]

Bernardet et al.

[11] Patent Number: 4,994,164
[45] Date of Patent: Feb. 19, 1991

[54] METAL ION IMPLANTATION APPARATUS

[75] Inventors: Henri Bernardet, Saint Michel sur Orge; Chantal Thiebaut, Villiers sur Marne, all of France

[73] Assignee: U.S. Philips Corporation, New York, N.Y.

[21] Appl. No.: 453,032

[22] Filed: Dec. 11, 1989

Related U.S. Application Data

[63] Continuation of Ser. No. 224,967, Jul. 27, 1988, abandoned.

[30] Foreign Application Priority Data

Aug. 5, 1987 [FR] France ............................ 87 11130

[51] Int. Cl.$^5$ ............................................. C23C 14/48
[52] U.S. Cl. ............................ 204/298.41; 204/192.38
[58] Field of Search ................ 204/192.12, 192.31, 204/192.38, 298 BD, 298 PI, 298 D, 298.04, 298.05, 298.41; 250/423 R, 425, 426, 427; 118/723

[56] References Cited

U.S. PATENT DOCUMENTS

| | | | |
|---|---|---|---|
| 2,239,642 | 4/1941 | Burkhardt et al. | 204/298 PJ |
| 3,117,022 | 1/1964 | Bronson et al. | 204/192.31 X |
| 3,832,514 | 8/1974 | Antonov | 204/298 D |
| 3,925,187 | 12/1975 | Bernard | 204/298 BD |
| 3,961,103 | 6/1976 | Aisenberg | 204/298 PI X |
| 4,142,958 | 3/1979 | Wei et al. | 204/298 BD |
| 4,251,725 | 2/1981 | Adkisson | 250/425 X |
| 4,563,610 | 1/1986 | Takagi et al. | 250/423 R X |
| 4,620,913 | 11/1986 | Bergman | 204/298 BD |
| 4,634,331 | 1/1987 | Hertel | 204/298 MC |
| 4,693,760 | 9/1987 | Sioshansi | 204/192.31 X |
| 4,717,461 | 1/1988 | Strahl et al. | 204/298 MC |
| 4,722,298 | 2/1988 | Rubin et al. | 204/298 MC |

*Primary Examiner*—Nam X. Nguyen
*Attorney, Agent, or Firm*—Paul R. Miller

[57] ABSTRACT

A metallurgic implantation apparatus of metal ions having a large emitting surface, a considerable flux and a controllable implantation depth comprises within an implantation chamber held in vacuo at least one vacuum arc ion source (1, 2, 3, 4) from which the ions (5) are extracted and projected onto a target plate (9) by means of an extraction and focusing electrode (6,7) and of an acceleration electrode (8) polarized at a very high and at a low voltage, respectively. The target plate (9) bombarded by the projection of ions emits a flux of secondary electrons, which are repelled by a suppression electrode (10) polarized negatively with respect to the target plate connected to ground.

23 Claims, 5 Drawing Sheets

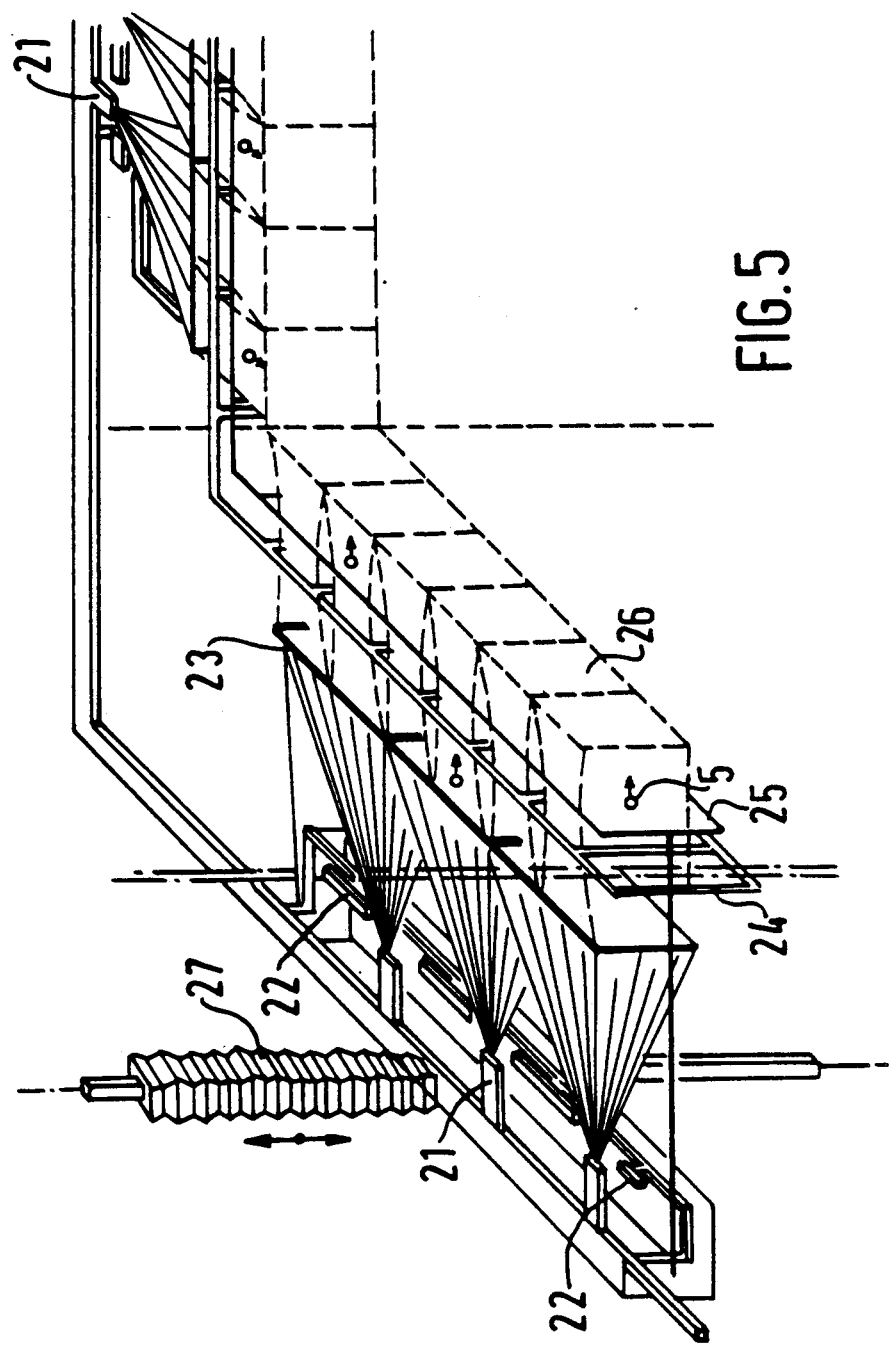

METAL ION IMPLANTATION APPARATUS

This application is a continuation of previous parent application U.S. Ser. No. 07/224,967 filed July 27, 1988, now abandoned, and all benefits of such earlier application are hereby claimed for this new continuation.

The invention relates to a metal ion implantation apparatus suitable for industrial applications of the metallurgic type or for the manufacture of metastable alloys having new metallurgic characteristics.

The modern apparatuses for metallurgic use are of two types;

gas ion (nitrogen, oxygen, rare gas . . . ) implantation apparatus, metal ion implantation apparatus from vapours of metal salts and comprising a mass separator. In these apparatuses, the flow rates are low and the cost is very high.

The sources of ions from vapour or gas operate at comparatively high pressures (a few $10^{-3}$ to a few $10^{-1}$ Torr) causing either an extraction of the ions of the source of small surface area and hence of low flow rate (in order to avoid a considerable increase of pressure in the acceleration zone), or large extraction (essentially used for gas ions) producing a high pressure in the acceleration zone resulting in a large number of interactions between ions and neutral atoms and a decrease of the average energy of the ions; the result is a decrease of the average depth of penetration and enlargement of the implantation poorly controlled.

The implantation of metal can also be obtained by ion bombardment (generally with gas ions, nitrogen or rare gas) of a simultaneous metal deposit on the same substrate (for example evaporation.)

An apparatus of this kind is described in an article by T. Sato et al, published in the magazine "Journal Vacuum Sci. Technology, A4 (3) of May/June 1986, pp. 784–787.

The invention has for its object to provide implantation apparatuses of even higher performance suitable for industrial applications from vacuum arc ion sources permitting a high flow rate on a wide surface and having with respect to the other sources the following advantages:

absence of a gas feed system, operation in vacuo excluding more particularly the differential pumping indispensable for implantation apparatus having a high flow rate, small dimensions of the plasma source.

The emission of important fluxes thus ensures an accurately defined implantation in mass and energy and at controllable depths. In this connection, these implantation apparatuses resemble those used in microelectronics for doping semiconductor materials.

The implantation apparatus according to the invention is characterized in that it comprises within an implantation chamber held in vacuo at least one vacuum arc ion source comprising at least one plasma-emitting cathode, an anode and a trigger electrode, a focussing and extraction electrode for focussing and extracting the ions of the plasma onto a target plate, and an acceleration electrode.

The focussing and extraction electrode and the acceleration electrode are polarizable at a very high and at a very low voltage, respectively.

Bombardment of the target by the ion beam causes a secondary flux of electrons. Preferably the vacuum arc ion source comprises means for cooling to absorb secondary electrons and/or the implantation apparatus comprises within the implantation chamber a suppression electrode for suppressing secondary electrons.

With a common ion source, the extraction and focusing electrode can be constituted by a multi-orifice structure having a design depending on the acceleration, the voltages applied, the density and the mass of the ions.

The implantation apparatus can comprise several sources operating in parallel and constituted by several cathodes of the same material (or of different materials). Depending upon the form of the implanted target plate, several apparatus variations can be designed.

If the target plate has a planar geometry, the sources will be disposed along the same line with an anode and a gate in common as the case may be. The target plate will preferably be movable.

If the interior (or the exterior) of a target plate of cylindrical form should be implanted, the sources will be uniformly distributed along the periphery of a circumference so as to be directed to the exterior (or the interior) of this circumference and movable along the axis of the cylinder.

If the internal (or external) surfaces of a target plate having the form of, for example, a square or rectangular parallelepipedon should be implanted, the source will be uniformly distributed in the same manner along the perimeter of a square or of a rectangle, but be directed to the exterior (or the interior) of this square or of this rectangle and made movable by means of a translation system in a direction parallel to the edges of the parallelepipedon or by means of pivot arms that can be controlled by a computer.

The elimination of the undesired ions will be effected by means of various filtering devices.

Figure 2:
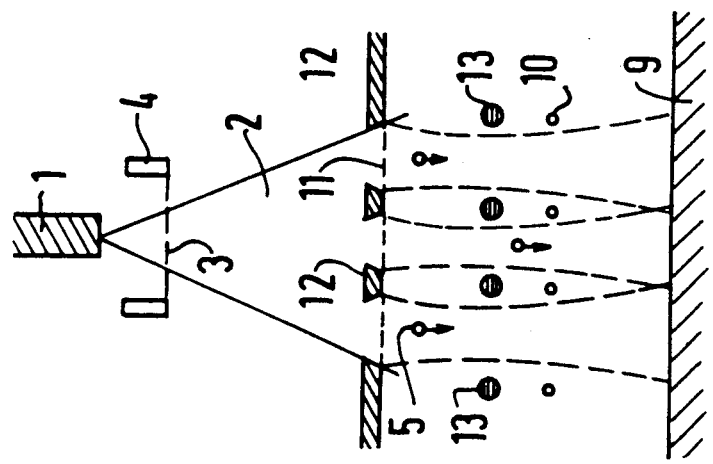
Figure 1:
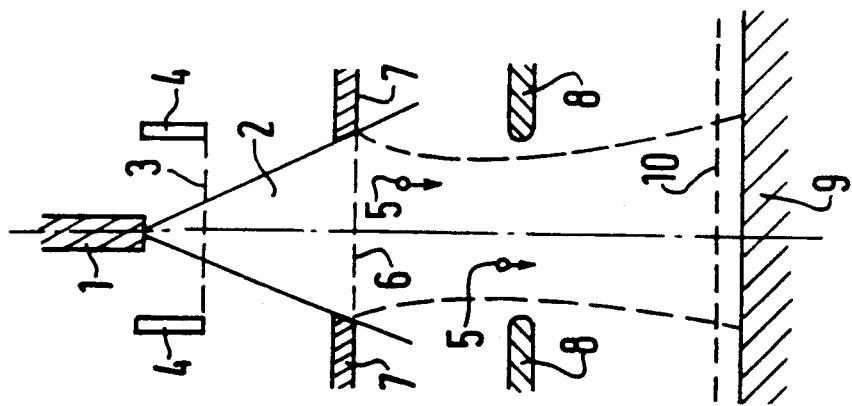
Figure 6:
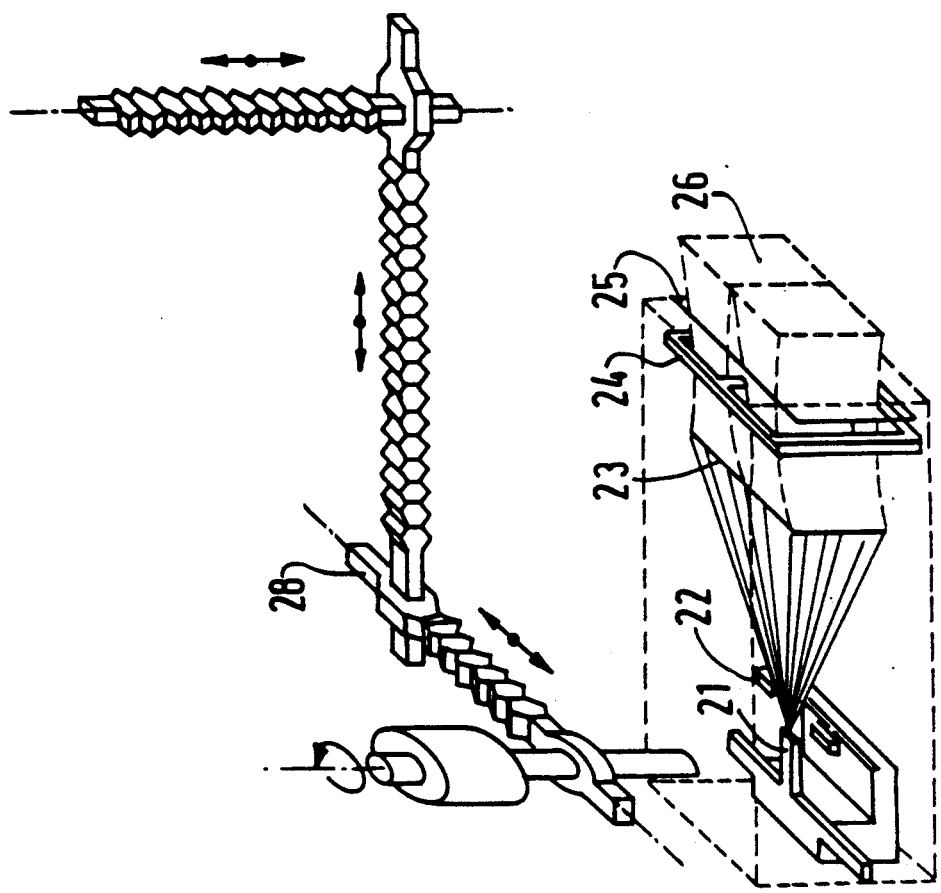
Figure 4:
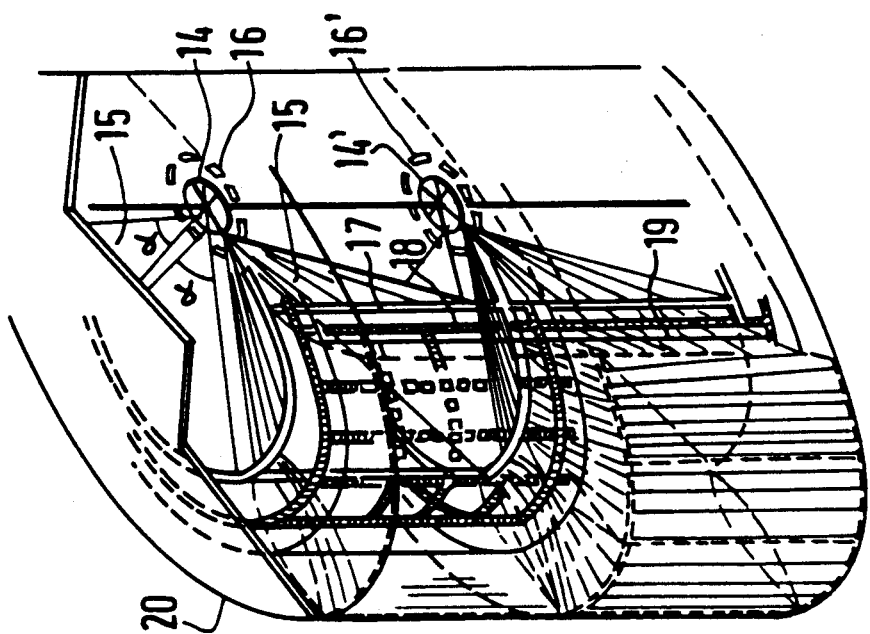
Figure 9:
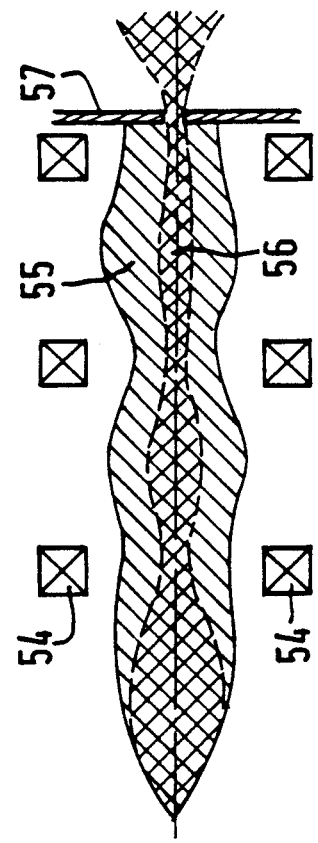
Figure 10:
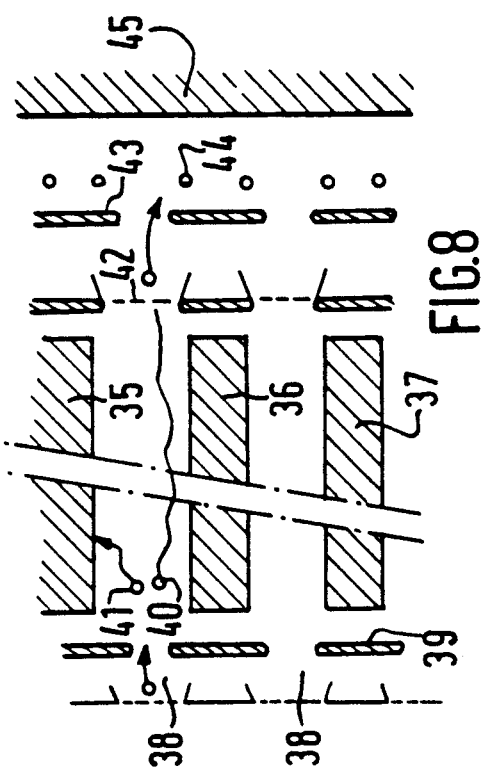
Figure 11:
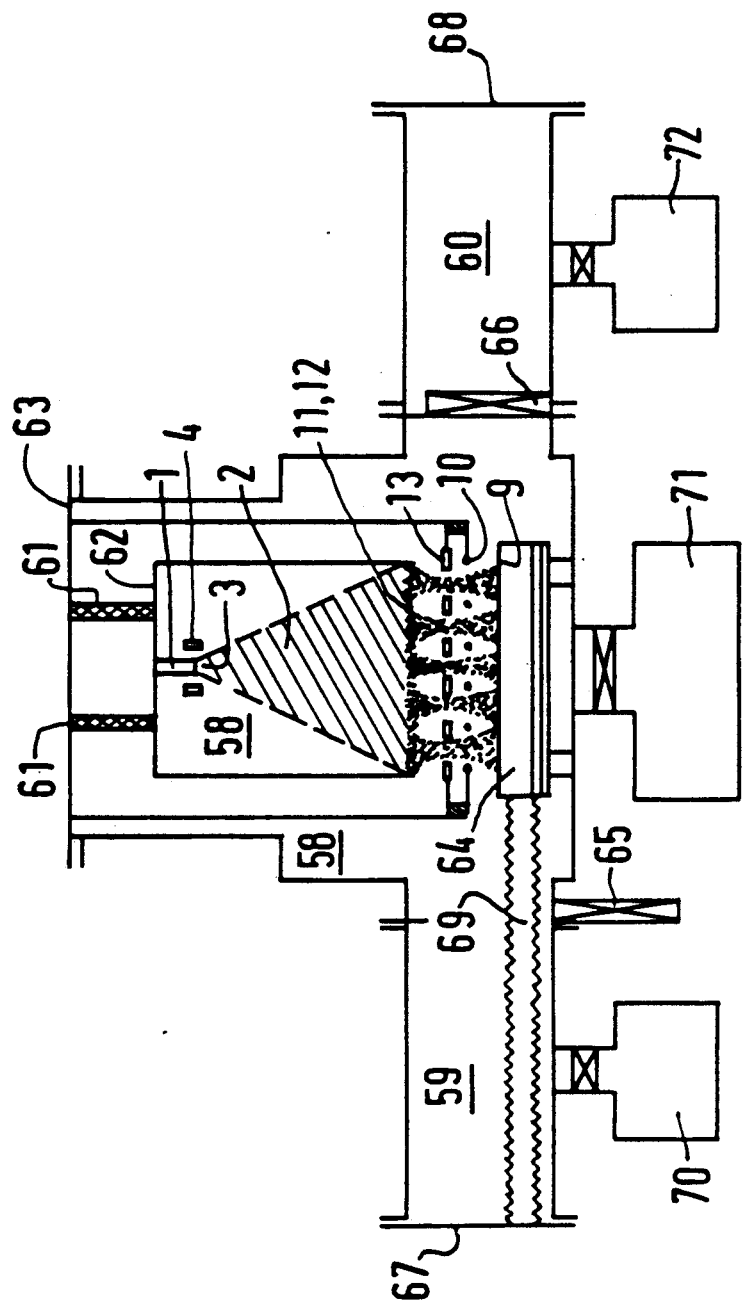

In order that the invention may be readily carried out, it will now be described more fully, by way of example, with reference to the accompanying drawings, in which:

FIG. 1 shows a simple structure of an implantation apparatus according to the invention constituting the base cell, FIG. 2 shows a structure comprising several cells close to the preceding cell comprising a single source, FIG. 3 shows an embodiment having several parallel sources for the implantation of a planar surface, FIG. 4 shows an embodiment having several parallel sources for implantation of the internal face of a cylindrical surface, FIGS. 5 and 6 show an embodiment having several parallel sources for implantation of the external surfaces of a square or rectangular parallelepipedon, the sources being displaced by means of a system of translation or of pivot arms, FIGS. 7, 8, 9 and 10 show circuit diagrams of several filtering means, FIG. 11 shows the circuit diagram of the assembly of an industrial equipment of a metallurgic implantation apparatus.

The identical elements belonging to different Figures are designated by the same reference symbols.

FIG. 1 shows the simple structure of a base cell of the implantation apparatus according to the invention, whose flow rate from a single vacuum arc ion source is limited by thermal heating problems depending upon the cooling means used and not shown.

This results in that the calculated flow rate per unit time and controlled by the ratio between the real operating time and the overall time (Ma pulsatory mode of operation) can vary from a few mA to several Amperes.

The vacuum arc ion source comprises a cathode 1 emitting a plasma 2, an anode 3 and an ignition or gate electrode 4.

The extraction of the ions 5 of the plasma is effected by an orifice that may be equipped with an extraction grid 6 and the focusing of the beam by a simple electrode 7, whose dimensions depend upon those of the structure. The acceleration of the ions is obtained by means of the acceleration electrode 8 provided with a single orifice of large dimensions depending upon the flow rate aimed at.

The ions arriving at the target plate 9 lead to a substantially secondary electron emission that can reach a level several times that of the incident ion beam. In these conditions, two solutions are possible:

Absorption of energy on the ion source part of the implantation apparatus by a simple natural or forced cooling (circulation of a cooling fluid);

positioning of an electrode 10 suppressing secondary electrons constituted by a ring or a grid of high transparence, which will apply to the target plate a small electrical field opposite to the emission of these electrons. The atoms that may be extracted from this electrode and deposited on the target plate to be treated are small in number and are repulverized in their quasi totality by the incident beam.

The target plate can be movable so that a homogeneous deposit is obtained. An automatic control with measurement of the incident ion currents by probes equipped with Faraday cages disposed at various points of the target plate and a data control of the measurement results can be provided if the accuracy of the implantation dose is a critical parameter.

The target plate is cooled by natural or forced cooling depending upon the type of application, the working rate, the flow rate and the energy of the implanted ions. The nature of the cooling and the mechanical means for realizing this cooling, more particularly in the case of implantation of ions for finishing treatments of work pieces, depend upon the kind of application.

FIG. 2 shows an extraction structure composed of several cells similar to the preceding structure that can be disposed in a manner that will appear from the diagram on which are distinguished:

common vacuum arc ion source (cathode 1 emitting the plasma 2, anode 3, gate 4).

A multi-orifice extraction and focusing structure (11, 12) defined as a function of the view-point of acceleration, the voltages applied, the density of the mass of the ions 5 and the type of bombardment aimed at.

A multi-orifice acceleration electrode 13 that can be brought to a negative potential with respect to the target plate so as to repel the secondary electrons from the target plate. An improvement with respect to the ion beam optics can be obtained by the addition of a second electrode (not shown) situated between the extraction electrode 12 and the acceleration electrode 13 permitting modulation by means of its polarization of the form of the beam and more particularly the dimensions and the homogeneity of the bombarded zone. This structure moreover introduces the possibility—by control of its polarization voltage—of causing the mass of ions to vary by a simple change of the source and without large changes of the ion beam optical system.

A target plate 9 generally at a zero potential. This target plate will generally be movable in order to ensure a homogeneity of the bombardment. It may be equipped depending upon the type of polarization of the acceleration electrode with a system for suppressing secondary electrons 10 (grid, electrode in the form of a funnel, etc. . . . ).

An interesting variation for the implantation of the same material at a higher flow rate or on a larger surface or for the simultaneous implantation of materials of different kinds and the mounting of several ion sources in parallel and with cathodes of the same material or of different materials is shown in the principle circuit diagram of FIG. 3.

If, for example, three metallic materials $M_1$, $M_2$, $M_3$ should be implanted simultaneously, the corresponding cathodes 1', 1" and 1''' emit the plasmas 2', 2" and 2''', respectively, which are mixed with each other to form the mixture 2'+2"+2'''.

The multisource control can be unique, where the ignition of an arc by means of the gate 4 can lead to the ignition of the adjacent structures.

The anode 3 of the multisource may be common or specific, the control of the current being effected by the cathode circuit.

The metering can be effected by modulation of the current supplied and/or by the control of the pulse width.

The other elements of the circuit diagram: extraction and focusing electrodes (11, 12), acceleration electrode 13, suppression electrode 10 and target plate 9 remain identical to those of the circuit diagram of the unique source of FIG. 2.

An important variation utilizing to the maximum the aforementioned advantages of the plasma ion sources is that sources are obtained having an extraction surface of different geometry and adapted to the material to be implanted.

By way of example, various structures emitting plasma in accordance with the form of the target plate can be designed.

FIG. 4 shows diagrammatically a structure having a cylindrical emission zone constituted by a multicathode system, of which the projections of plasma emitted by the cathodes disposed along a circle overlap each other on a cylindrical surface integral with the extraction electrode and depending upon the number and the position of the cathodes 14, upon the apic angle of the projections of the plasma 15 (approximately 60°), upon the transparence of the anode 16 and upon the distance between the cathode sections.

The emitted plasma covers integrally the extraction electrode 17 and a uniform implantation is thus obtained on the internal surface of the cylindrical target plate 20 after the passage of the ion beams through the acceleration electrode 18 and the suppression electrode 19.

The cathode sources may be made of a single material or of several materials.

In order to increase the deposition rate, several levels of cathodes 14, 14' . . . may be available, the grids 16, 16' being or not being common.

The internal surface of the cylindrical target plate 20 can then be implanted by a simple displacement of the assembly of the ion source (or of the target plate).

FIG. 5 shows the circuit diagram of a structure for the implantation on the external surface 26 of target plate constituted by a tube of square or rectangular cross-section; the ion sources (cathodes 21 and anodes 22) are then disposed along a square or a rectangle and can be made movable—by the addition of a translation system 27 using bellows—the external surface of the tube 26 can thus be implanted after passage of the ion beams through the extraction and focusing electrode 23, the acceleration electrodes 24 and the suppression electrodes 25.

In these structures, the anode can be common and the cathode can have an individual supply (current and pulse width individually controlled). These assemblies can be movable and can be displaced opposite to the work-piece to be treated, as is shown in FIG. 5, or inversely be in a stationary position and the target plate (work piece to be treated) be movable.

In the same sense, an ion source constituted by one or several cathodes of the same or of different materials can be made integral with a pivot arm according to a technology compatible with vacuum and ultra-vacuum shown in FIG. 6. This arm 28 can be controlled by a computer from a programme realized, for example, after experiments on a prototype equipped with ion bombardment collectors. The quantities of ions deposited and their bombardment energy would then be controllable and be adapted according to needs with a high accuracy.

It should be noted that the part to be implanted, if it has large dimensions and can readily be obturated at the ends (internal cylinder), can constitute the vacuum chamber. The implantation apparatus can be fixed at one of the ends and the pumping system at the other end.

For the implantation on an article of complex form, the internal or external ion sources are disposed and orientated so that the axis of the flux of plasma is perpendicular to the surface and that the density deposited is as homogeneous as possible.

After the description of structures of implantation apparatus, it is necessary to explain the principles governing the operation of these systems in order to reach the solutions needed for an industrial realization.

The flow rate of ions extracted from an apparatus according to the same principle as that of the circuit diagram of FIG. 2 depends upon:

the flux of plasma arriving at the extraction electrode (influence of the parameters associated with the ion sources—arc current, distance between extraction electrode and cathode, transparence of the anode grid;

the transparence and the form of the extraction electrode;

the electrical field applied to the limit of the plasma (meniscus), whose form has a direct incidence on the convergence of the extracted and accelerated beam;

the mass of the extracted ions.

In the case of a homogeneous plasma, the density of the extracted current $J_i+$ can be written as:

$$J_i^+ \propto \frac{V^{\frac{3}{2}}}{d_c^2} \sqrt{\frac{q_i}{M_i^+}}$$

in which formula V is the extraction voltage, $d_c$ is the distance between the acceleration electrode (or the equivalent surface) and the meniscus of the plasma and $q/M^+$ is the ratio between the charge of the ion at its mass.

As to the convergence of the beam, it depends upon the extracted density, upon the geometry and upon the acceleration voltages.

In the case of a multi-material implantation apparatus, the rules governing its operation are identical to those of a monomaterial beam having a ratio $q_e/M_e$, such as:

$$\sqrt{\frac{q_e}{M_e}} = C_1 \sqrt{\frac{q_1}{M_1}} + \sqrt{\frac{q_2}{M_2}} + \ldots + C_j \sqrt{\frac{q_j}{M_j}}.$$

knowing that $C_1, C_2, \ldots C_j$ are the concentrations of the different kinds of ions and that $C_1+C_2+ \ldots +C_j=1$.

For certain applications, it can be interesting to implant the ions at an accurately determined depth, which requires ions of constant energy. Now, in the vacuum arc sources, the quantity of multicharge ions is very substantial and hence the energy of the ions can vary by a factor 1, 2, 3 or even 4. In these conditions, the implantation apparatus must comprise a system permitting the elimination of ions of undesired energy.

In order to benefit from the importance of the ion sources using arc plasmas, it is necessary to have available a system permitting the passage of high flow rates, i.e. having wide inlet and outlet orifices.

The systems proposed satisfy this requirement, although roughly they exhibit a substantial reduction of the flux of ions supplied by these systems.

Figure 7:
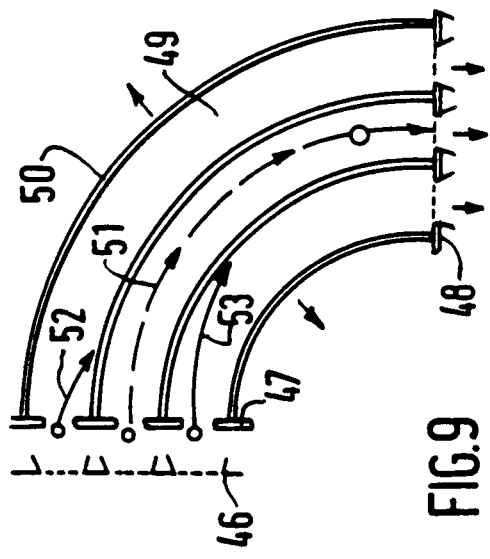

The system shown diagrammatically in FIG. 7 represents a filter comprising quadrupolar cells consisting in the simultaneous use of numerous cells constituted by quadrupoles. A quadrupole is formed by four cylindrical rods 29, 30, 31 and 32 simulating an equipotential network of the hyperbola type and polarized at $+V/2$, with $V=V_1+V_0 \cos \omega t$.

The movement of an ion within this system is given in a normal coordinate system by the system of equations:

$$m \frac{d^2x}{dt^2} = - \frac{e}{r_0^2} (V_1 + V_0 \cos\omega t)x$$

$$m \frac{d^2y}{dt^2} = - \frac{e}{r_0^2} (V_1 + V_0 \cos\omega t)y$$

$$m \frac{d^2z}{dt^2} = \text{constant}.$$

The solution of these equations known as Mathieu equations are complex. It is simply assumed that for a reduced range of the values (w, $r^2_0$, $V_0$, $V_1$) conditions of stability of the oscillating path of the ions are present, which can thus traverse the filter. These ions of reduced mass $m_0=M_0/q$, (M being the atomic mass of the ion and q being its electrical charge), will be the only ions to traverse the filter and hence to be implanted.

The ion movement in a quadrupolar filter cell is shown in perspective view and diagrammatically in the Figure by the paths 33 and 34 in broken lines.

Figure 8:
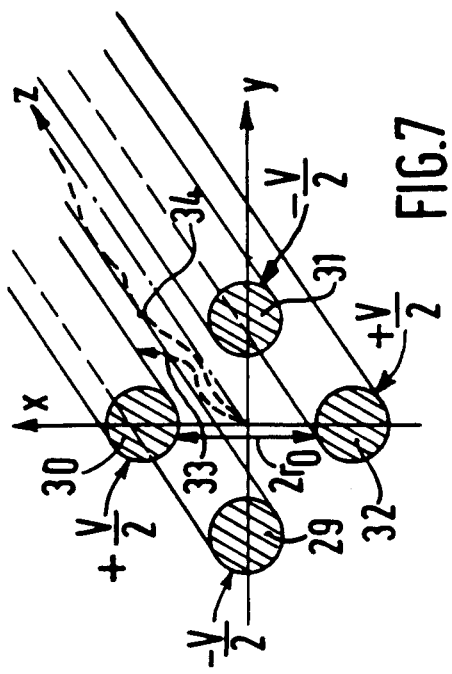

FIG. 8 shows in longitudinal sectional view the arrangement of an assembly of filtering cells 35, 36 and 37 of the type described above between the input and output electrodes (shown diagrammatically) of the implantation apparatus.

Successively on the input side the extraction orifices 38 of the anode plasma and the acceleration orifices 39 of the injected ions 40 and 41 are present. The ions 40 of the metal to be implanted of reduced mass $m_0$ traverse the filter at a constant sliding speed. The ions 41 of reduced mass above $m_0$ are absorbed by the filter.

After having traversed the filters, the ions to be implanted in the substrate 45 traverse successively on the output side the grid or orifice 42 intended to limit the penetration of the final electrical acceleration field of the ions, the electrode 43 of acceleration of the ions to the desired energy and the suppression electrode 44.

FIG. 9 shows a magnetic deviation filter arranged between the input diaphragm 46 and the electrode 47 of extraction of ions on the one hand and the acceleration electrode 48 on the other hand. This system utilizes the properties of deviation of the ions by a magnetic field, that is to say that the radius of gyration $R_j$ of an ion of reduced mass m and of energy eV in a perpendicular induction field B is given by the expression:

$$R = \frac{1}{B} \sqrt{\frac{2mV}{e}}$$

It is constituted by multichannels 49 permitting the injection over a large dimension of a considerable flux of ions. These channels are limited by parts of a circle 50 having a common center permitting the passage of the desired ion masses, for example along the path 51, and the interception of the undesired ion masses, for example along the paths 52 and 53. For this purpose, the magnetic field must decrease in inverse proportion to the radius of the channel so as to maintain the constant product B.R.

A variation with respect to the multichannel system is its replacement by diaphragms intercepting the ions not having the desired path. As for the preceding system, the ions are accelerated at the input of the filter at an average energy of a few keV. At the output they are subjected to the main acceleration, which leads them to the nominal implantation energy.

FIG. 10 shows the principal circuit diagram of a filter for enrichment of ions of the same electrical charge.

The originality of this system resides in the fact that it is applied directly to the plasma of the ion source, i.e. before extraction. It is not so perfect as the two preceding systems and has only an enrichment of ions having a given ratio $q/M^+$.

It utilizes the property of canalization of the plasma by the magnetic field lines produced by the coils 54. The convergent force lines correspond a reduction of the section of the plasma. This phenomenon is generally explained by the limitation of diffusion of the electrons of the plasma, which in turn attract the ions so as to maintain the neutrality condition of the plasma.

Experience has shown that for low magnetic field values and for a projected plasma (of the plasma arc type), the ions of small equivalent mass are more sensitive to this effect than the ions of heavier mass.

The plasma is thus separated along the axis of the coils 54 into an enriched plasma of "heavy mass" 55 farthest from the axis and into a plasma of "light" mass 56 closest to the axis. The latter, having a smaller section, is extracted through interception diaphragms 57 and appears again from the output of the diaphragm because it is no longer subjected to the effect of the magnetic field.

The diagram of FIG. 11 gives an example of an industrial equipment of a metal implantation apparatus. For the sake of clarity of the diagram, an equipment is described as being provided with a single source for implanting a target plate of planar geometry.

In this equipment, the following parts are distinguished;

the implantation chamber 58, which permits the obtaining of a vacuum in the equipment. For the industrial equipment shown, which requires a continuous operation with a considerable number of components, it is equipped with two locks 59, 60, which permit the introduction of the materials to be implanted and the support of the latter, and auxiliary means (cooling, movement, measurement current and temperature). The target plate will be kept at constant temperature by circulation of a fluid not shown and will be equipped with measuring instruments required to know the parameters of use.

The ion source is at positive very high voltage and hence mounted on isolators 61. This source in accordance with the circuit diagram of FIG. 2 comprises the various electrodes already described: cathode 1 emitting the plasma 2 and anode 3, ignition electrodes 4 and, as the case may be, an anti-microprojection system (not shown). These electrodes are cooled by means of a device (not shown) for circulation of a fluid or a thermal conductor for the cathode and the anode.

This assembly is integral with the same base plate 62, on which the isolators 61 are mounted.

The equipment further comprises:

the extraction-focusing grid 11, 12, the acceleration electrode 13 and the suppression electrode 10 of suitable form and accurately positioned with respect to each other. A possibility of mounting is the fixation from the same support (the upper wall 63 of the implantation chamber) of the assembly of these electrodes which are brought to very different potentials.

The target plate 9 carried by the target plate carrier 64, which has to satisfy a given number of requirements for the homogeneity and the control of the implanted dose, the dissipation of the energy applied and the ease of mounting of the components to be mounted.

The control of homogeneity is effected by probes not shown such as Faraday cages distributed at different points of the target plate and connected to a computer, which will control the deposition rate and the exposure of the target plate as a function of the dose received.

The dissipation of the energy is in given applications the most critical point. In the major part of the cases, the temperature control will be effected on probes representative of the target plates to be treated and coupled to a measuring station, such as the dose probes. The time of residence of the target plate in the beam will then be a function of the dose received and of the temperature, the parameters being the position of the target plate and the working rate of the implantation apparatus. The dissipation of the deposited energy applied is a function of the kind of target plate. Each target plate will be subjected to a specific treatment compatible with the specifications of the deposition and its quality. The matrix of the target plate carrier will be a function of the use and the cooling method will depend upon it such as cooling by circulation of fluid in direct contact with the target plate carrier, cooling by heat conduction, and cooling by circulation of gas. Probes could be immersed to follow the evolution of the temperature on the cooling side and to permit in this manner showing of the anomalies.

The target plate carrier 64 introduced into the space by means of a system of locks is mounted on a movable bellows system, within which also pass the cooling fluids, and a measuring systems (measurement of current and temperature). The introduction locks required for industrial equipment and ultravacuum laboratory equipment are composed of a space 59, 60 closed by a valve of large passage 65, 66, and of a removable surface 67, 68 equipped with a system for setting the target plate into motion. In the industrial equipment, the locks are rapidly and simply closed and opened; and the displacements of the removable surface can be effected on rails in order to facilitate the positioning of the material to be implanted. The system of two locks shown in FIG. 11 permits the possibility of degassing in one of them.

After reloading, the materials to be implanted can be baked in order to eliminate the major part of the degassing before introduction into the implantation chamber.

After introduction into the implantation chamber, the target plate carrier 64 can be set into motion from fixed points integral with the space by means of an eccentric point or directly by means of a flexible system 69 shown in FIG. 11.

The pumping system 70, 71, 72 of which the type and kind are a function of the use, must at any rate be isolatable from the space and must as far as possible not retrodiffuse oil vapours because of the probable derivatives of the treated products and the problems of maintaining the voltage between the different electrodes.

Beside the applications of implantation of metal ions, the metallurgic implantation apparatus according to the invention may be used to realize deposits of the "reactive" type. For this purpose, the apparatus operating at a zero acceleration voltage, the ion source becomes a plasma source, which, after having traversed the acceleration assembly, will be deposited on the target plate. The maintenance of a residual pressure of a given reactive gas such as $O_2$, $N_2$ ..., permits obtaining layers of compounds such as oxides, nitrides, ...

The reactivity speed of the deposit is a function of the pressure p, of the temporal density of the deposit, of the source current $I_s$, and of the surface of the deposit.

Since the assembly can be controlled by a computer, a compound is obtained determined by the control of p or of $I_s$ or of $T_s$ (pulse width).

This deposit can be simultaneously bombarded with ions of the same kind or of different kind in order to be "mixed" with the support or to be doped.

In the same type of application, after implantation, there can be deposited on the surface a layer protecting the implanted substrate with (or without) initial implantation for a better adhesion of the protective layer. As can be seen, the implantation apparatus can be used as a system of metallization of cathode material in the absence of any acceleration voltage.

We claim:
1. A metal ion implantation apparatus comprising:
   (a) an implantation chamber,
   (b) first means for producing a vacuum within said chamber,
   (c) at least one vacuum arc ion source within said chamber, said vacuum arc ion source including
      (i) at least one cathode for emitting a plasma,
      (ii) at least one anode and ignition electrode for controlling said plasma,
      (iii) at least one focussing electrode and at least one extraction electrode combined for focussing and extracting ions from said plasma,
      (iv) at least one acceleration electrode for accelerating said ions at an acceleration voltage,
   (d) at least one target plate disposed in said chamber and receiving said ions, and
   (e) lock means disposed in said chamber for introducing said target plate into said vacuum arc ion source and for supporting said target plate within said vacuum arc ion source, said lock means being an enclosed part of said implantation chamber at opposing sides of said vacuum arc ion source.

2. An implantation apparatus according to claim 1, wherein said implantation chamber includes second means for cooling said vacuum arc ion source.

3. An implantation apparatus according to claim 2, wherein said implantation chamber further includes at least one suppression electrode for suppressing secondary electrons from said target plate.

4. An implantation apparatus according to claim 1, wherein said implantation chamber includes at least one suppression electrode for suppressing secondary electrons from said target plate.

5. An implantation apparatus according to claim 1, wherein said focussing electrode has only one orifice.

6. An implantation apparatus according to claim 1, wherein said focussing electrode has a structure with a plurality of orifices.

7. An implantation apparatus according to claim 6, wherein a plurality of said cathodes are disposed in parallel to form a plurality of plasmas.

8. An implantation apparatus accordant to claim 7, wherein said plurality of said cathodes are of different materials.

9. An implantation apparatus according to claim 7, wherein said target plate has a planar geometry, and wherein said plurality of cathodes are disposed in line with a common anode and ignition electrode for implanting ions on said target plate with said planar geometry.

10. An implantation apparatus according to claim 1, wherein a plurality of said vacuum arc ion sources are disposed in parallel in said chamber to operate in parallel on said target plate.

11. An implantation apparatus according to claim 10, wherein said plurality of said vacuum arc ion sources are disposed uniformly about the periphery of a closed shape in at least one level, said plurality of sources being directed toward said closed shape, and wherein said target plate has a tubular shape, said plurality of said vacuum arc ion sources being axially movable relative to said tubular shape.

12. An implantation apparatus according to claim 11, wherein said closed shape is cylindrical.

13. An implantation apparatus according to claim 11, wherein said closed shape is polygonal.

14. An implantation apparatus according to claim 11, wherein a translation system moves said plurality of sources parallel to the axis of said tubular shape.

15. An implantation apparatus according to claim 11, wherein a pivot arm controlled by a computer moves said plurality of sources.

16. An implantation apparatus according to claim 1, wherein filtering means are disposed in said implantation chamber for eliminating ions of undesired energy.

17. An implantation apparatus according to claim 16, wherein said filtering means is disposed in said vacuum arc ion source before said at least one extraction electrode, said filtering means acting directly on said plasma by canalizing said plasma along lines of force of a magnetic field.

18. An implantation apparatus according to claim 16, wherein said filtering means is disposed in said vacuum arc ion source after said at least one extraction electrode, said filtering means including quadrapolar cells polarized at high frequency.

19. An implantation apparatus according to claim 16, wherein said filtering means is disposed in said vacuum arc ion source after said at least one extraction electrode, said filtering means including circular magnetic deviation multichannels.

20. An implantation apparatus according to claim 1, wherein said acceleration voltage is zero, wherein said vacuum arc ion source provides a source of plasma, said plasma being deposited on said target plate after transversal of said acceleration electrode, and wherein a reactive gas of at least one of $O_2$, $N_2$, etc. is introduced at a residual pressure in said implantation chamber to deposit at least one of oxides, nitrides, etc. on said target plate.

21. An implantation apparatus according to claim 1, wherein said lock means include small chambers disposed at said opposing sides, said small chambers having removable end surfaces for opening and closing said implantation chamber.

22. An implantation apparatus according to claim 1, wherein said lock means include means for moving said at least one target plate.

23. An implantation apparatus according to claim 1, wherein said lock means include pumping mean for evacuating said implantation chamber, and valve mean for evacuating said lock means.

* * * * *